United States Patent [19]

Miura et al.

[11] 4,099,973
[45] Jul. 11, 1978

[54] PHOTO-SENSITIVE BIS-AZIDE CONTAINING COMPOSITION

[75] Inventors: Kiyoshi Miura; Yoshifumi Tomita, both of Mobara, Japan

[73] Assignee: Hitachi, Ltd., Japan

[21] Appl. No.: 723,063

[22] Filed: Sep. 14, 1976

Related U.S. Application Data

[63] Continuation of Ser. No. 497,035, Aug. 13, 1974, abandoned.

[30] Foreign Application Priority Data

Oct. 24, 1973 [JP] Japan .................... 48-119007

[51] Int. Cl.$^2$ .................... G03C 1/52; G03C 1/70
[52] U.S. Cl. .................... 96/115 R; 96/36; 96/67; 96/75; 96/91 N
[58] Field of Search .................... 96/91 N, 115 R, 75, 96/67, 91 R, 92, 36.4, 36

[56] References Cited

U.S. PATENT DOCUMENTS

| | | | |
|---|---|---|---|
| 2,848,328 | 8/1958 | Hepher | 96/91 N |
| 2,916,376 | 12/1959 | Ritter et al. | 96/93 |
| 2,937,085 | 5/1966 | Seven et al. | 96/91 R |
| 2,990,281 | 6/1961 | Printy et al. | 96/75 |
| 3,334,584 | 8/1967 | Sites | 96/93 |
| 3,526,504 | 9/1970 | Celeste | 96/93 |
| 3,589,907 | 6/1971 | Dijkstra | 96/93 |
| 3,615,538 | 10/1971 | Peters et al. | 96/91 N |
| 3,679,419 | 7/1972 | Gillich | 96/91 N |
| 3,698,902 | 10/1972 | Gaspar | 96/93 |

OTHER PUBLICATIONS

Kosar, J., "Light-Sensitive Systems", Wiley & Sons, 1965, pp. 48, 113 and 295.

*Primary Examiner*—Charles L. Bowers, Jr.
*Attorney, Agent, or Firm*—Craig & Antonelli

[57] ABSTRACT

When a water-soluble alcohol having 4 to 6 hydroxyl groups is added to a photosensitive composition comprising a water-soluble polymer substance and a bisazide crosslinking agent, the polymer crosslinking reaction by said bisazide crosslinking agent is promoted and a polymer crosslinkage enough to form an image is produced even at a low exposure dose of ultraviolet ray. Thus, the photosensitive composition is highly sensitized as compared with prior art photosensitive compositions. The alcohol is exemplified by erythritol, pentitol, etc. and is preferably added in an amount of 1 – 100 parts by weight per 100 parts by weight of the water-soluble polymer substance.

7 Claims, No Drawings

PHOTO-SENSITIVE BIS-AZIDE CONTAINING COMPOSITION

This is a continuation of application Ser. No. 497,035 filed Aug. 13, 1974, now abandoned.

The present invention relates to a photosensitive material, that is, a photoresist comprising a water-soluble polymer substance and a bisazide crosslinking agent. More particularly, the invention pertains to a sensitized photosensitive composition.

It is known that photosensitive materials comprising a bisazide crosslinking agent and a water-soluble polymer substance such as polyvinyl alcohol, polyacrylamide, polyvinyl pyrrolidone or gelatine have heretofore been used generally as a material for forming an image. In the sensitive materials, the azido groups of the bisazide crosslinking agent are decomposed by exposure to ultraviolet ray. On the decomposition, the water-soluble polymer substance molecule present is subjected to crosslinkage. Thereby, the water-soluble polymer substance is converted into a water-insoluble polymer substance and a latent image is formed.

However, said crosslinkage is influenced by the decomposition degree of said diazide crosslinking agent, that is, the exposure dose of ultraviolet ray. Therefore, the prior art sensitive materials have a defect that an image cannot be formed satisfactorily at a small exposure dose of ultraviolet ray, that is, the material is lowly sensitive.

An object of the present invention is to provide a sensitive composition in which the above-mentioned defect of prior art sensitive materials has been obviated. This object is attained by adding a water-soluble alcohol having 4 to 6 hydroxyl groups. The water-soluble alcohol is preferably added in an amount of 1 to 100 parts by weight, and more preferably 5 to 50 parts by weight, per 100 parts by weight of a water-soluble polymer substance.

The water-soluble polymer substances which may be used in the sensitive compositions according to the present invention include polyvinyl pyrrolidone, polyacrylamide, polyvinyl alcohol, gelatine, acrylamide-diacetone acrylamide copolymer, acrylamide-vinyl alcohol copolymer, acrylamide-vinylpyrrolidone copolymer and a mixture thereof. Also, the bisazide crosslinking agent is exemplified by sodium 4,4'-diazidostilbene-2,2'-disulfonate, sodium 4,4'-diazidobenzalacetophenone-2-sulfonate and sodium 4,4'-diazidostilbene-α-carboxylate.

Also, the alcohols having 4 to 6 hydroxyl groups which may be added to a sensitive material comprising said water-soluble polymer substance and said bisazide crosslinking agent include erythritol ($C_4H_6(OH)_4$), pentitol ($C_5H_7(OH)_5$) such as arabitol or xylitol, hexitol ($C_6H_8(OH)_6$) such as sorbitol, dulcitol or mannitol, etc.

The sensitive compositions according to the present invention comprise said water-soluble polymer substance, said diazide crosslinking agent and said tetrahydric or sexhydric alcohol. The polyhydric alcohol accelerates polymer crosslinkage with the diazide crosslinking agent. Therefore, polymer crosslinkage enough to form an image even at a small exposure dose of ultraviolet ray occurs. In other words, a sensitive composition which has been more highly sensitized than usual sensitive composition can be obtained.

Also, vinyltris (β-methoxyethoxy) silane, N-β-(aminoethyl)-γ-aminopropylmethylmethoxysilane, N-β-(aminoethyl)-γ-aminopropylmethylmethoxysilane, etc. may be added to the sensitive compositions according to the present invention as an adhesiveness improver.

The following examples, in which all parts are expressed by weight, unless otherwise indicated, will serve to illustrate the practice of the invention in more detail.

EXAMPLE 1

Four sensitive compositions were prepared by adding 0, 0.10, 0.25 and 0.5 part of sorbitol ($C_6H_8(OH)_6$), respectively, to a sensitive material (photoresist) prepared by dissolving in 100 parts of water 1 part of polyvinyl pyrrolidone as a water-soluble polymer substance and 0.2 part of sodium 4,4'-diazidostilbene-2,2'-disulfonate. Each sensitive composition was coated onto glass and dried. The formed sensitive composition layer was exposed to ultraviolet ray stepwise by the use of an optical wedge and was then subjected to development with warm water. The lowly exposed portion wherein photo-crosslinkage had not been carried out sufficiently was washed off by this development. The least exposed portions formed in the respective four sensitive composition layers were compared to calculate the relative exposure doses at these portions. The results obtained are as follows:

| Amount of sorbitol added (parts) | Relative exposure dose |
| --- | --- |
| 0 | 1 |
| 0.10 | 0.85 |
| 0.25 | 0.7 |
| 0.5 | 0.5 |

As is clear from the above data, it was found that the sensitive material was sensitized by the addition of sorbitol.

Further, similar results were obtained by replacing sorbitol by dulcitol or mannitol.

EXAMPLE 2

Four sensitive compositions were prepared by adding 0, 0.10, 0.25 and 0.5 part of arabitol ($C_5H_7(OH)_5$), respectively, to a sensitive material prepared by dissolving in 100 parts of water a mixture of 0.5 part of polyvinyl pyrrolidone and 0.5 part of polyacrylamide as a water-soluble polymer substance, 0.3 part of sodium 4,4'-diazidostilbene-2,2'-disulfonate as a photo-crosslinking agent and 0.01 part of a functional alkoxysilane as an adhesiveness improver. Each sensitive composition was subjected to the same experiment as in Example 1. The results obtained are as follows:

| Amount of arabitol added (parts) | Relative exposure dose |
| --- | --- |
| 0 | 1 |
| 0.10 | 0.9 |
| 0.25 | 0.85 |
| 0.5 | 0.7 |

Similar results were obtained by replacing arabitol by xylitol.

What is claimed is:

1. A photosensitive composition consisting essentially of an admixture of crosslinking agent consisting of a bisazide compound, a water-soluble polymer substance which may be photo-crosslinked by said bisazide compound and an effective amount of a water-soluble alcohol having 4 to 6 hydroxyl groups to accelerate a photo-crosslinking reaction between said water-soluble polymer substance and said bisazide compound when said composition is exposed to a small dosage of ultraviolet rays, said water-soluble polymer substance being selected from the group consisting of polyvinyl pyrrolidone, polyacrylamide, polyvinyl alcohol, gelatine, acrylamide-diacetone acrylamide copolymer, acrylamide-vinyl alcohol copolymer, acrylamide-vinylpyrrolidone copolymer and a mixture thereof.

2. A sensitive composition according to claim 1, wherein the amount of said alcohol is 1 to 100 parts by weight per 100 parts by weight of said water-soluble polymer substance.

3. A sensitive composition according to claim 1, wherein said alcohol is selected from the group consisting of erythritol, pentitol and hexitol.

4. A sensitive composition according to claim 1, wherein said bisazide compound agent is selected from the group consisting of sodium 4,4'-diazidostilbene-2,2'-disulfonate, sodium 4,4'-diazidobenzalacetophenone-2-sulfonate and sodium 4,4'-diazidostilbene-α-carboxylate.

5. A sensitive composition according to claim 1, which further contains an adhesiveness improver.

6. In a photoresist composition containing an admixture of a bisazide compound and a water-soluble polymer substance capable of being photo-crosslinked with said bisazide compound when exposed to ultraviolet rays, the improvement wherein said composition consists essentially of said bisazide compound, said water-soluble polymer substance and from 1 to 100 parts by weight per 100 parts by weight of said water-soluble polymer substance of an alcohol selected from the group consisting of erythritol, pentitol, and hexitol, said water-soluble polymer substance being selected from the group consisting of polyvinyl pyrrolidone, polyacrylamide, polyvinyl alcohol, gelatine, acrylamide-diacetone acrylamide copolymer, acrylamide-vinyl alcohol copolymer, acrylamide-vinylpyrrolidone copolymer and a mixture thereof.

7. A sensitive composition according to claim 6, wherein said bisazide compound is selected from the group consisting of sodium 4,4'-diazidostilbene-2,2'-disulfonate, sodium 4,4'-diazidobenzalacetophenone-2-sulfonate and sodium 4,4'-diazidostilbene-α-carboxylate.

* * * * *